(12) United States Patent
Lachman et al.

(10) Patent No.: US 6,380,779 B1
(45) Date of Patent: Apr. 30, 2002

(54) EDGE-TRIGGERED, SELF-RESETTING PULSE GENERATOR

(75) Inventors: Jonathan E. Lachman, Fort Collins; J. Michael Hill, Ft Collins; Jim Dale Peterson, Loveland, all of CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/903,927

(22) Filed: Jul. 12, 2001

(51) Int. Cl.[7] ............................................... H03K 3/037
(52) U.S. Cl. ........................................ 327/199; 327/291
(58) Field of Search .................................. 327/175, 227, 327/208, 212, 264, 171, 272, 291, 293, 294, 299, 199

(56) References Cited

U.S. PATENT DOCUMENTS 6,133,758 A * 10/2000 Durham et al. ................ 326/93
6,225,841 B1 * 5/2001 Taguchi et al. ............... 327/122
6,320,437 B1 * 11/2001 Ma ................................ 327/153
6,329,867 B1 * 12/2001 Penney et al. ............... 326/121

* cited by examiner

*Primary Examiner*—Terry D. Cunningham
*Assistant Examiner*—Linh Nguyen
(74) *Attorney, Agent, or Firm*—John Pessetto

(57) ABSTRACT

An edge-triggered, self-resetting pulse generator where a pulse is initiated by a voltage transition and is reset using feedback from the output. A voltage transition is presented at one input of a two-input NOR gate and at the input of a circuit with three inverters in series. The output from the circuit with three inverters in series connects to the second input of the two-input NOR gate. This combination creates a voltage pulse that drives a transfer FET. The transfer FET creates a voltage on a latch. The latch stores the voltage presented on the input and then drives a delay-chain with an odd number of inverters. The output of the delay-chain drives a second transfer FET that resets the latch.

22 Claims, 1 Drawing Sheet

EDGE-TRIGGERED, SELF-RESETTING PULSE GENERATOR

FIELD OF THE INVENTION

This invention relates generally to electronic circuits. More particularly, this invention relates to integrated electronic circuits and pulse generators.

BACKGROUND OF THE INVENTION

One aspect of designing an integrated circuit (IC) is timing. Timing is the relationship between two or more signals with respect to time. A particular signal may need to be established at the input of a latch, before the latch is opened. This example is often called "setup time". Another example of a timing issue is a "race" condition. A race condition may occur when a signal propagates into a memory element (e.g. a latch) before it should. The memory element in this case may close too slowly while data from another circuit transitions fast enough to be stored in the memory. The data from the other circuit should have been stored on the next clock cycle. In some cases where timing is an important issue, a voltage pulse is created that may activate a circuit for a time corresponding to the width of the pulse. The width of the pulse in time may be critical. The width of the pulse should be well defined over process variations as well as variations in temperature and voltage. An example of a circuit where a pulse may be used to control timing is a RAM (Random Access Memory) device.

RAM cells store digital bit values and allow those values to be read at a later time. A RAM cell also allows previous stored values to be written over by new digital bit values. A DRAM (Dynamic Random Access Memory) cell, and an SRAM (Static Random Access Memory) cell are examples of RAM cells that are used in integrated circuit designs. A SRAM cell maintains data without a refresh cycle while a DRAM cells must be refreshed periodically. SRAM cells are used in many electronic applications requiring data storage such as in an internal cache memory of a microprocessor. DRAM cells and SRAM cells may be used to create stand-alone DRAM and SRAM integrated circuits. RAM cells generally comprise one or more storage elements, and additional circuitry to allow charge to transfer from the storage elements to bitlines. Bitlines are electrically connected to a group of RAM cells and to circuitry at the ends of the bitlines for reading writing, and prechanging the bitlines. The value of the digital bit stored in the storage element is developed on the bitlines by transfering charge from a storage element to the bitlines. Transferring charge from a storage element to the bitlines causes the voltage on the bitlines to change. The rate of change in voltage between the bitlines may be relatively slow due to the number of RAM cells electrically connected to the bitlines and the current sinking capability of an individual RAM cell. In order to avoid unacceptably long delays created by waiting for a RAM cell to cause a nearly full rail-to-rail (power supply to power supply) voltage swing on the bitlines, a sense-amp may be connected to the bitlines to amplify a smaller voltage swing generated by the RAM cell. A sense-amp is capable of amplifying the signal developed on the bitlines after a relatively small signal has been developed on the bitlines by a RAM cell. The sense-amp compares the two bitlines and determines which has a larger voltage when there is only a small voltage differential between them. The sense-amp compares the voltage differential on the two bitlines after the sense amp is triggered by a delayed clock signal. The delay in the clock signal may be timed by several methods. One method is to use a signal from a selected wordline. A wordline is a signal that activates transfer gates on a row of RAM cells. After these transfer gates are activated, differential signal is developed on each bitline. Another method used to create a delay is to use an appropriate number of inverters connected in series. If the delayed clock signal goes active too early, the sense-amp may not be able to "sense" the correct digital signal. If the delay of the delayed clock signal is delayed too long, the access time of the RAM may not be optimal In addition to optimally timing the start of a delayed signal to a sense-amp, it is important to limit the time that the sense-amp is activated. If a sense-amp is active for a relatively long period of time, it may cause higher peak power for circuitry with one or more sense-amps. It may also cause an increase in the offset voltage of sense-amps that are designed in SOI (Silicon on Insulator). Sense-amps designed in SOI may have transistors with different $V_t$'s (threshold voltages) due to charge accumulating on the body of these transistors. Since these transistors may have different bias conditions while the sense-amp is enabled, an offset voltage may be developed. In order to overcome an offset voltage developed by this mechanism, precharge circuitry must be active for a longer period of time or must have larger transistors. Either case is not desired in the design of RAMs. There is a need in the art for a well-timed, edge-triggered, self-resetting pulse generator. The apparatus described in this invention, an edge-triggered, self-resetting pulse generator, meets this need.

SUMMARY OF THE INVENTION

An embodiment of the invention provides an edge-triggered, self-resetting pulse generator. A negative-edge signal (a transition from a high voltage to a lower voltage) is presented to one input of a two-input NOR gate and to the input of a circuit with three inverters in series. The output of the circuit with three inverters in series is connected to the second input to the NOR gate. The combination of the circuit with three inverters and the NOR gate creates a positive pulse that drives the gate of an NFET (N-type field effect transistor). The pulse on the gate of the NFET pulls the input of a latch to ground. The latch drives, through a buffer, the output of the pulse generator to a high value. The high value is maintained until feedback from the output of the pulse generator drives the input of the latch high. The output of the pulse generator is then driven low and is held low until another negative edge signal is presented at the input of the pulse generator. The feedback path includes several delay elements in series that drive the gate of a PFET (P-type Field Effect Transistor). The PFET drives the input of the latch high when the gate of the PFET is driven low. The feedback enables the pulse generator to be self-resetting. The invention may be easily adapted to other technologies used to fabricate integrated circuits.

Other aspects and advantages of the present invention will become apparent from the following detailed description, taken in conjunction with the accompanying drawing, illustrating by way of example the principles of the invention.

DETAILED DESCRIPTION OF THE PREFERRED EMBODIMENT

Figure 1:
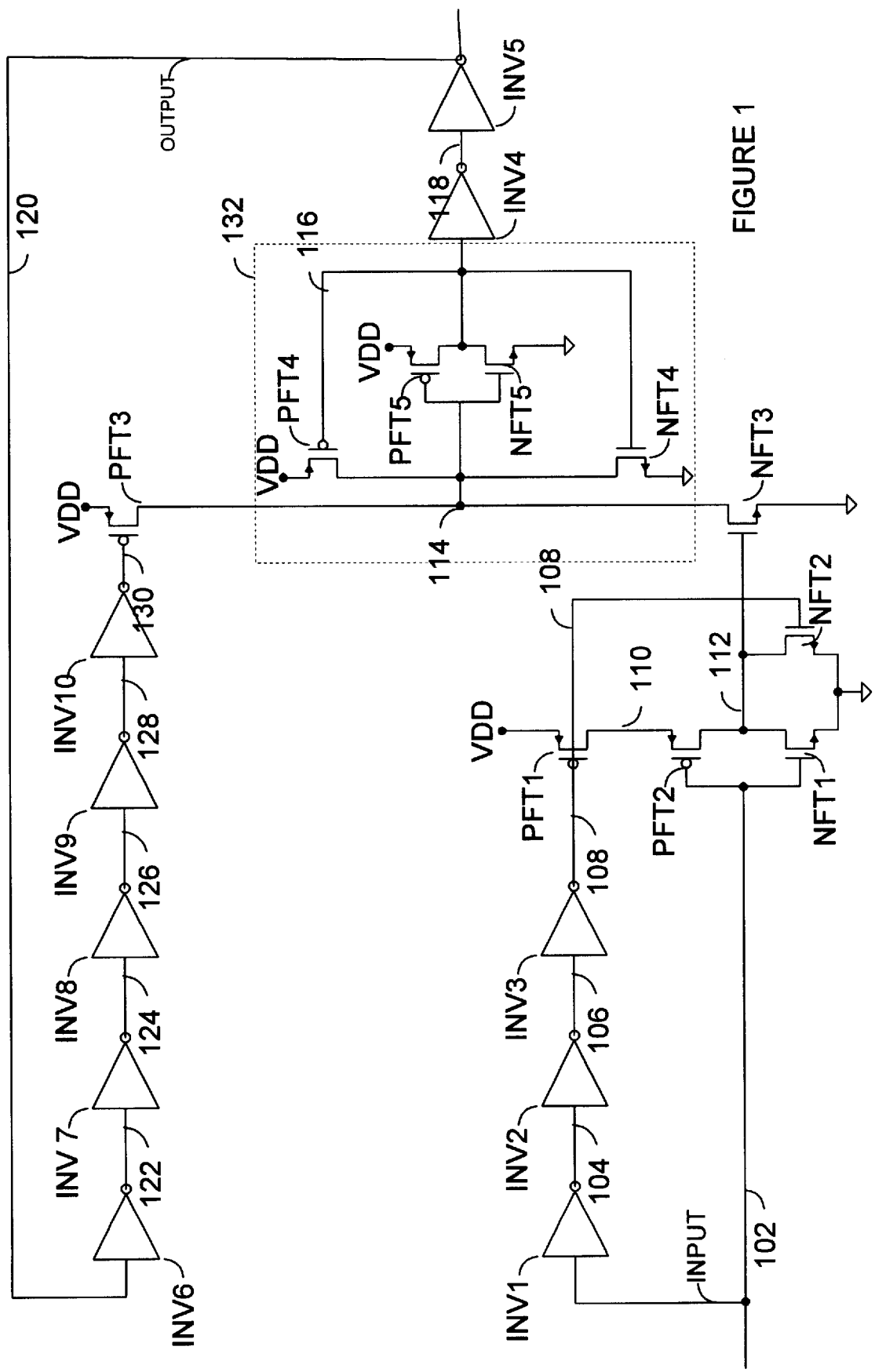
FIG. 1 is a schematic drawing of an edge-triggered, self-resetting pulse generator.

FIG. 1 is a schematic diagram of an edge-triggered, self-resetting pulse generator. The gates of PFET, PFT2 and NFET, NFT1 are connected to the input of the pulse generator, INPUT and the input of inverter, INV1 at node 102. The output of inverter INV1 is connected to the input of inverter, INV2 at node 104. The output of inverter INV2 is connected to the input of inverter, INV3 at node 106. The output of inverter INV3 is connected to the gates of PFET, PFT1 and NFET, NFT2 at node 108. The drain of NFET, NFT1, the drain of PFET, PFT2, the drain of NFET, NFT2, and the gate of NFET, NFT3 are connected to node 112. The drain of NFET, NFT3, the drain of PFET, PFT3, the drain of PFET, PFT4, the drain of NFET, NFT4, the gate of PFET PFT5, and the gate of NFET, NFT5 are connected to node 114. The drain of PFET, PFT5, the drain of NFET, NFT5, the gate of PFET, PFT4, the gate of NFET, NFT4, and in the input to inverter INV4 are connected to node 116. The output of inverter, INV4 is connected to the input of inverter, INV5 at node 118. The output of inverter INV5 is connected to the input of inverter INV6 at node 120, OUTPUT. The output of inverter INV6 is connected to the input of inverter INV7 at node 122. The output of inverter INV7 is connected to the input of inverter INV8 at node 124. The output of inverter INV8 is connected to the input of inverter INV9 at node 126. The output of inverter INV9 is connected to the input of inverter INV10 at node 128. The output of inverter INV10 is connected to the gate of PFET, PFT3 at node 130. The source of PFET, PFT3, the source of PFET, PFT4, the source of PFET, PFT5, and the source of PFET, PFT1 are connected to the power supply, VDD. The sources of NFETs, NFT1, NFT2, NFT3, NFT4, and NFT5 are connected to the power supply, GND.

To illustrate the operation of the pulse generator shown in FIG. 1, assume that node 102 is charged to a "high" voltage (representing a logical "1"). Node 102 should be charged to a high voltage when the circuit containing the pulse generator is powered up. This assures the pulse generator will not miss the first rising edge on node 102. In a steady-state condition with node 102 charged high, node 104 is charged to a "low" voltage (representing a logical "0"), node 106 is high, and node 108 is low. Since node 108 is low and node 102 is high, node 110 is charged high. Since node 102 is high, NFET (N-type Field Effect Transistor), NFT1 pulls node 112 to a low voltage. Because node 112 is low, NFET NFT3 is "off" and does not actively drive node 114, the input to a latch, 132. The latch, 132, contains NFETs NFT4 and NFT5 and PFETs (P-type Field Effect Transistor) PFT4 and PFT5.

Node 114 will be charged to a high voltage at steady-state after power-up. To understand why this is so, assume that node 114 is charged low. If node 114 is low, node 116 must be high, node 118 must be low, node 120 must be high, node 122 must be low, node 124 must be high, node 126 must be low, node 128 must be high, and node 130 must be low. Because node 130 is low, it activates PFET, PFT3 and PFT3 charges node 114 high. When node 114 changes from a low to high voltage, node 116 must now be low, node 118 must be high, node 120 must be low, node 122 must be high, node 124 must be low, node 126 must be high, node 128 must be low, and node 130 must be high. Because node 130 is high, PFET, PFT3 is "off" and node 114 remains at a high voltage. The steady-state voltage of node 114 is latched at a high value and remains high until the gate of NFET, NFT3, node 112 is driven to high voltage and discharges node 114 to a low voltage.

After reaching a steady-state condition, where node 114 and node 102 are high, the pulse generator is ready to create an edge-triggered, self-resetting pulse. A negative-going voltage transition (i.e. a transition from a high voltage to a low voltage) from another circuit drives node 102 low. Driving node 102 to a low voltage, turns PFET, PFT2 "on". Since PFETs PFT1 and PFT2 are "on" node 112 is charged to a high value. Driving node 112 a high value, turns NFET, NFT3 "on". NFET, NFT3, then pulls node 114 low. A low voltage is then latched into latch 132.

The signal presented on node 102 propagates through three inverters, INV1, INV2, and INV3, and presents a high voltage on node 108. Because node 108 is a high voltage, NFET, NFT2 discharges node 112 to a low voltage. A low voltage on node 112 disables NFET, NFT3. NFET, NFT3 is no longer on and doesn't change the value of node 114. Node 114 remains latched at a low voltage. The signal on node 114 drives through latch 132, inverter INV4, and inverter INV5 presenting a high voltage on node 120, OUTPUT. In addition to driving the OUTPUT, node 120 feeds back to the latch, 132, through inverters INV6, INV7, INV8, INV9, INV10, and PFET, PFT3. The positive-going voltage transition (i.e. a low voltage going to a high voltage) on node 120 marks the start of the pulse created by the pulse generator.

A high voltage on the OUTPUT, node 120, results in a low voltage on the gate of PFET, PFT3. A low voltage on the gate of PFET, PFT3 turns on PFET, PFT3 which then "flips" the latch, 132 connected to node 114 from a low voltage to a high voltage. The latch, 132 then drives inverters INV4 and INV5, resetting node 120 low. Resetting the pulse-generator is independent of the input voltage on node 102. The time between node 120 going high to node 120 going low is approximately the pulse width of the pulse created by the pulse generator. The width of the pulse is determined by the delay-time a signal takes to propagate through the feedback path that includes inverters, INV6, INV7, INV8, INV9, INV10, PFET, PFT3, latch 132, inverter INV4, and inverter, INV5. The width of the pulse may be adjusted by adding or deleting inverters, or changing the drive strength of the inverters. The pulse-width is adjusted to meet the timing needs of a particular situation and may be determined by using an available FET-level simulator.

When node 102 is driven from a low voltage to a high voltage, node 114 and the feedback path described above are unaffected electrically. When another circuit drives the input, node 102, of the pulse generator high, FFET, PFT2 is turned "off". The signal on node 102 propagates through inverters, INV1, INV2, and INV3, and drives node 108 low. A low voltage on the gate of PFET, PFT1, turns PFET, PFT1 on and charges node 110 high. After node 110 is charged high, the pulse-generator is ready to create another pulse. Another pulse may be created by driving the input of the pulse generator, node 102, to a low voltage.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An edge-triggered, self-resetting pulse generator comprising:

a one-shot circuit with an input and an output, that produces a voltage pulse in time on the output when a voltage transition is presented on the input, the input connected to an input of the pulse generator and the output connected to a first node;

a transfer FET of a first type with an input and an output, the input connected to the first node and the output connected to a second node;

a latch with an input and an output that stores a voltage presented on the input, the input connected to the second node and the output connected to a third node;

a delay-circuit with an input and an output, the input connected to the third node and the output connected to a fourth node;

a transfer FET of a second type with an input and an output, the input connected to the fourth node and the output connected to the second node.

2. The edge-triggered, self-resetting pulse generator as in claim 1 wherein the transfer FET of the first type is a NFET.

3. The edge-triggered, self-resetting pulse generator as in claim 1 wherein the transfer FET of the second type is a PFET.

4. The edge-triggered, self-resetting pulse generator as in claim 1 wherein the transfer FET of the first type is a NFET and the transfer FET of the second type is a PFET.

5. An edge-triggered, self-resetting pulse generator comprising:

a one-shot circuit with an input and an output, the first input connected to an input of an inverter-chain having an odd number of inverters in series and to an input of a two-input NOR gate, an output of the inverter-chain connected to a second input of the two-input NOR gate, the output of the two-input NOR gate connected to a first node;

a transfer FET of a first type with an input and an output, the input connected to the first node and the output connected to a second node;

a latch with an input and an output that stores a voltage presented on the input, the input connected to the second node and the output connected to a third node;

a delay-circuit with an input and an output, the input connected to the third node and the output connected to a fourth node;

a transfer FET of a second type with an input and an output, the input connected to the fourth node and the output connected to the second node.

6. The edge-triggered, self-resetting pulse generator as in claim 5 wherein the inverter-chain consists of three inverters in series.

7. The edge-triggered, self-resetting pulse generator as in claim 5 wherein the transfer FET of the first type is a NFET and the transfer FET of the second type is a PFET.

8. The edge-triggered, self-resetting pulse generator as in claim 6 wherein the transfer FET of the first type is a NFET and the transfer FET of the second type is a PFET.

9. An edge-triggered, self-resetting pulse generator comprising:

a one-shot circuit with an input and an output, that produces a voltage pulse in time on the output when a voltage transition is presented on the input, the input connected to an input of the pulse generator and the output connected to a first node;

a transfer FET of a first type with an input and an output, the input connected to the first node and the output connected to a second node;

a latch with an input and an output, the input connected to an input of a first inverter and the second node, the output of the first inverter connected to an input of a second inverter, a third node and to the output of the latch, an output of the second inverter connected to the input of the latch, the second node, and the input of the first inverter;

a delay-circuit with an input and an output, the input connected to the third node and the output connected to a fourth node;

a transfer FET of a second type with an input and an output, the input connected to the fourth node and the output connected to the second node.

10. The edge-triggered, self-resetting pulse generator as in claim 9 wherein the transfer FET of the first type is a NFET and the transfer FET of the second type is a PFET.

11. An edge-triggered, self-resetting pulse generator comprising:

a one-shot circuit with an input and an output, that produces a voltage pulse in time on the output when a voltage transition is presented on the input, the input connected to an input of the pulse generator and the output connected to a first node;

a transfer FET of a first type with an input and an output, the input connected to the first node and the output connected to a second node;

a latch with an input and an output that stores a voltage presented on the input, the input connected to the second node and the output connected to a third node;

a delay-circuit with an input and an output, the input connected to an input of an inverter-chain having an odd number of inverters in series and to the third node, the output connected to an output the inverter-chain and to a fourth node;

a transfer FET of a second type with an input and an output, the input connected to the fourth node and the output connected to the second node.

12. The edge-triggered, self-resetting pulse generator as in claim 11 wherein the delay-circuit consists of seven inverters connected in series connecting the output of the latch to the input of the transfer FET of the second type and the fourth node.

13. The edge-triggered, self-resetting pulse generator as in claim 11 wherein the transfer FET of the first type is a NFET and the transfer FET of the second type is a PFET.

14. The edge-triggered, self-resetting pulse generator as in claim 12 wherein the transfer FET of the first type is a NFET and the transfer FET of the second type is a PFET.

15. An edge-triggered, self-resetting pulse generator comprising:

a one-shot circuit with an input and an output, the first input connected to an input of a first inverter-chain having an odd number of inverters in series and to an input of a two-input NOR gate, an output of the first inverter-chain connected to a second input of the two-input NOR gate, the output of the two-input NOR gate connected to a first node;

a transfer FET of a first type with an input and an output, the input connected to the first node and the output connected to a second node;

a latch with an input and an output, the input connected to an input of a first inverter and the second node, the output of the first inverter connected to an input of a second inverter, a third node and to the output of the latch, an output of the second inverter connected to the input of the latch, the second node, and the input of the first inverter;

a delay-circuit with an input and an output, the input connected to a second inverter-chain having an odd number of inverters in series and to the third node, the output connected to the output of inverter-chain and to a fourth node;

a transfer FET of a second type with an input and an output, the input connected to the fourth node and the output connected to the second node.

16. The edge-triggered, self-resetting pulse generator as in claim 15 wherein the transfer FET of the first type is a NFET and the transfer FET of the second type is a PFET.

17. The edge-triggered, self-resetting pulse generator as in claim 15 wherein the delay-circuit consists of seven inverters connected in series connecting the output of the latch to the input of the transfer FET of the second type and the fourth node.

18. The edge-triggered, self-resetting pulse generator as in claim 15 wherein the first inverter-chain consists of three inverters in series.

19. The edge-triggered, self-resetting pulse generator as in claim 15 wherein the first inverter-chain consists of three inverters in series and the second inverter-chain consists of seven inverters in series.

20. The edge-triggered, self-resetting pulse generator as in claim 19 wherein the transfer FET of the first type is a NFET and the transfer FET of the second type is a PFET.

21. An edge-triggered, self-resetting pulse generator comprising:

a means for creating an edge-triggered pulse connected to an input of the pulse generator and to a first node;

a means for transferring charge to and from a second node by controlling the charge on the first node;

a means for storing charge after a voltage had been presented on the second node and supplying a second voltage on a third node;

a means for creating a delay from the third node to a fourth node;

a means for transferring charge to and from a second node by controlling the charge on the fourth node.

22. A method for manufacturing an edge-triggered, self-resetting pulse generator:

a) fabricating a one-shot circuit with an input and an output, that produces a voltage pulse in time on the output when a voltage transition is presented on the input, the input connected to an input of the pulse generator and the output connected to a first node;

b) fabricating a transfer FET of a first type with an input and an output, the input connected to the first node and the output connected to a second node;

c) fabricating a latch with an input and an output that stores a voltage presented on the input, the input connected to the second node and the output connected to a third node;

d) fabricating a delay-circuit with an input and an output, the input connected to the third node and the output connected to a fourth node;

e) fabricating a transfer FET of a second type with an input and an output, the input connected to the fourth node and the output connected to the second node.

* * * * *